United States Patent
Navarro et al.

(10) Patent No.: US 12,042,827 B1
(45) Date of Patent: Jul. 23, 2024

(54) INTEGRATED ULTRASONICS AND MEGASONICS CLEANING

(71) Applicant: Yield Engineering Systems, Inc., Fremont, CA (US)

(72) Inventors: Louis Navarro, Valencia, CA (US); Venugopal Govindarajulu, Lehi, UT (US); Dragan Cekic, Princeton, NJ (US); M Ziaul Karim, San Jose, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 18/203,401

(22) Filed: May 30, 2023

Related U.S. Application Data (60) Provisional application No. 63/465,017, filed on May 9, 2023.

(51) Int. Cl.
 *B08B 3/12* (2006.01)
 *H01L 21/67* (2006.01)

(52) U.S. Cl.
 CPC .......... *B08B 3/12* (2013.01); *H01L 21/67057* (2013.01); *B08B 2203/007* (2013.01)

(58) Field of Classification Search
 None
 See application file for complete search history.

(56) References Cited

U.S. PATENT DOCUMENTS

| | | | |
|---|---|---|---|
| 5,383,484 A | * | 1/1995 | Thomas ............ H01L 21/67057 134/1 |
| 7,334,588 B2 | | 2/2008 | Verhaverbeke et al. |
| 8,496,757 B2 | | 7/2013 | Beck et al. |
| 9,492,852 B2 | | 11/2016 | Wang et al. |
| 2018/0056340 A1 | | 3/2018 | Teng et al. |
| 2019/0013218 A1 | * | 1/2019 | Park .................. H01L 21/02052 |

(Continued)

FOREIGN PATENT DOCUMENTS

| | | | |
|---|---|---|---|
| JP | 05317820 | * | 12/1993 |
| JP | 2008227300 | * | 9/2008 |

(Continued)

OTHER PUBLICATIONS

Translation of WO2012043090 by Endo, published Apr. 5, 2012.*

(Continued)

*Primary Examiner* — Mikhail Kornakov
*Assistant Examiner* — Ryan L Coleman
(74) *Attorney, Agent, or Firm* — Finnegan, Henderson, Farabow, Garrett & Dunner, LLP (57) ABSTRACT

A cleaning device includes a tank configured to contain a cleaning liquid and one or more substrates in the cleaning liquid. A megasonic transducer array is coupled to the tank and configured to direct megasonic frequency waves to surfaces of the substrates. Multiple pairs of ultrasonic transducers are also coupled to the tank and configured to direct ultrasonic frequency waves to surfaces of the substrates. The megasonic transducer array includes a support plate with a plurality of megasonic transducers and a central plane that extends perpendicular to the support plate. The multiple pairs of ultrasonic transducers are arranged in a mirror symmetric manner on opposite sides of the central plane.

20 Claims, 7 Drawing Sheets

(56) References Cited

U.S. PATENT DOCUMENTS

2020/0406312 A1  12/2020  Teng et al.

FOREIGN PATENT DOCUMENTS

| KR | 20090064871 | * | 6/2009 |
|----|-------------|---|--------|
| WO | WO2012043090 | * | 4/2012 |

OTHER PUBLICATIONS

Translation of JP05317820 by Sano, published Dec. 3, 1993.*
Translation of JP2008227300 by Hasegawa, published Sep. 25, 2008.*
Translation of KR20090064871 by Wi, published Jun. 22, 2009.*
Haoxian Lu et al, "Differential Removal of Nanoparticles on the Surface of a Thin Film Substrate," ACS Omega, http://pub.acs.org/journal/acsodf, pp. 16280-16287 p. 16280-16287).
Manish Keswani, "Megasonic Cleaning of Wafers in Electrolyte Solutions: Possible Role of Electro-acoustic and Cavitation Effects," The University of Arizona University Libraries, UA Campus Repository, http://hdl.handle.net/10150/193651, download date May 17, 2023 @ 14:23:54 (pp. 215).
"Cleaning Silicon Wafers for Research & Development," University Wafer, https://www.universitywafer.com/how-to-clean-silicon-wafers.html, May 21, 2023 @ 10:57 am (pp. 9).
"Fundamentals of Ultrasonic & Megasonic Cleaning," Reprinted from Nov./Dec. 2009 Process Cleaning Magazine and Copyright @ 2009 by Gardner Publications, Inc., 6915 Valley Ave., Cincinnati, Ohio 45244-3029 (pp. 6).
Sami Awad, Ph.D., Vice President Crest Ultrasonics Corp., Reprinted from Precision Cleaning Magazine, Nov. 1996 @ Witter Publishing Co., Inc. (pp. 6).
Vetrimurugan et al., "Ultrasonic and Megasonic Cleaning to Remove Nano-Dimensional Contaminants from Various Disk Drive Components," International Journal of Innovative Research in Science, Engineering and Technology (An ISO 3297: 2007 Certified Organization) vol. 2, Issue 11, Nov. 2013, ISSN: 2319- 8753, www.ijirest.com, (pp. 5971-5977 [7 pages]).
Chun-Lin Chu et al., "The Suitability of Ultrasonic and Megasonic Cleaning of Nanoscale Patterns in Ammonia Hydroxide Solutions for Particle Removal and Feature Damage," Semiconductor Sciences and Technology, Open Access, IOP Publishing, https://doi.org/10.1088/1361-6641/ab675d, downloaded Feb. 5, 2023 @ 14:36 (pp. 10).
Posted on Sep. 30, 2019 by John Fuchs, "Particle Size Removal vs. Ultrasonic Frequency," GTC Technical Blog, @ 2023 Cleaning Technologies Group, All Rights Reserved, https://techblog.ctgclean.com/2019/09/micron-size-va-frequency/, May 17, 2023 @ 10:44 am (pp. 5).
"Semiconductor Cleaning: Processes, Methods, and Reasons," Utmel Electronic, May 20, 2022, https://www.utmel.com/blog/categories/semiconductor/semiconductor-cleaning-processes-methods-and-reasons, downloaded May 21, 2023 @ 11:03 am (pp. 7).
Mohammad Kazemi et al., "Substrate Cleaning Using Ultrasonics/Megasonics," Corresponding Author: Helmuth, Treichel, helmuth@sunsonix.com, (pp. 9).
Lawrence AZAR, "Understanding and Evaluating Ultrasonic and Megasonic Cleaners," Process Cleaning Magazine, Sep./Oct. 2007, www.processcleaning.com, (pp. 40-43 [4 pages]).

* cited by examiner

INTEGRATED ULTRASONICS AND MEGASONICS CLEANING

CROSS-REFERENCE TO RELATED APPLICATIONS

The present application claims priority to U.S. Provisional Patent Application No. 63/465,017, filed May 9, 2023, which is incorporated herein by reference in its entirety.

TECHNICAL FIELD

The present disclosure relates to devices and methods for cleaning parts using ultrasonic and megasonic frequencies.

BACKGROUND

Particulate contamination is a major cause of yield loss in a number of industries. Precision optical surfaces need to be as free of contaminant particles as possible. Aerospace and aircraft guidance parts, surgical parts, and electronic parts also require extreme cleanliness. Semiconductor manufacturing places perhaps the most stringent demands upon its cleaning processes (e.g., wafer cleaning). Particles introduced by chemical reactions during processing, or deposited via human or automated wafer handling, can subsequently shield lithographic reproduction, cause oxidation-induced stacking faults, and lead to both short and open circuits resulting in lower yields. Particulate contamination must also be controlled in the manufacture of state-of-the-art integrated circuits. To a first approximation, particulate control is governed, by the so-called "one-tenth rule," which specifies the need to control particles to one tenth the minimum circuit linewidth. As technology advances, linewidths, and line-to-line spacings are getting smaller to maintain Moore's Law for silicon compatible devices such as displays, optics, and IC devices making cleaning requirements more important.

Typically brushes or scrubbers are used to clean particles from substrates and wafers using Standard Clean 1 (SC1) chemistry. For example, a solution of DI water, Hydrogen peroxide, and Ammonium hydroxide is used to remove particles from the substrates prior to processing. However, due to the pH of the solution, particles removed from the surface may stay in the solution and re-deposit back on the wafer surface. Furthermore, brushes may scratch and other cause other defects (e.g., breakage of lines and features) on the substrate surface and lower yield. The cleaning devices and methods of the current disclosure may alleviate at least some of the above-described issues.

SUMMARY

Several embodiments of devices and methods for cleaning a semiconductor substrate using integrated ultrasonics and megasonics are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one embodiment, a device for cleaning at least one substrate is disclosed. The device may include a tank configured to contain a cleaning liquid and at least one substrate support configured to be positioned within the tank. The at least one substrate support may be configured to support the at least one substrate. A megasonic transducer array may be coupled to the tank and configured to direct megasonic frequency waves to one or more surfaces of the at least one substrate. The megasonic transducer array may include a support plate with a plurality of megasonic transducers coupled thereto. A central plane that extends perpendicular to the support plate may pass through the at least one substrate support positioned within the tank. Multiple pairs of ultrasonic transducers may also be coupled to the tank and configured to direct ultrasonic frequency waves to one or more surfaces of the at least one substrate. The multiple pairs of ultrasonic transducers may be arranged in a mirror symmetric manner on opposite sides of the central plane.

Various embodiments of the disclosed device may alternatively or additionally include one or more of the following features: each ultrasonic transducer of the multiple pairs of ultrasonic transducers may include a longitudinal axis inclined at an angle between about 40-50o with the central plane; the plurality of megasonic transducers of the megasonic transducer array may be arranged parallel to each other and extend perpendicular to the central plane; the plurality of megasonic transducers may include at a first set of megasonic transducers spaced apart from each other by a first distance and a second set of megasonic transducers spaced apart from each other by the first distance, wherein the first set and the second set may spaced apart from each other by a second distance greater than the first distance; the device may further include a liner positioned within the tank and the liner may be configured to receive the cleaning liquid therein; the tank may include stainless steel and the liner includes quartz; the multiple pairs of ultrasonic transducers may include between 2-20 pairs of ultrasonic transducers; the at least one substrate support may include at least two substrate supports, and each substrate support may be configured to support a plurality of substrates spaced apart from each other; the at least one substrate support may be configured to support a plurality of substrates such that each substrate of the plurality of substrates may extend substantially perpendicular to the central plane.

In another embodiment, a method of cleaning at least one substrate is disclosed. The method may include disposing at least one substrate support in a cleaning liquid within the tank. The at least one substrate support may include the at least one substrate positioned thereon. The method may also include directing sonic waves at a megasonic frequency from a megasonic transducer array coupled to the tank to one or more surfaces of the at least one substrate through the cleaning liquid. The megasonic transducer array may include a support plate with a plurality of megasonic transducers coupled thereto. A central plane that extends perpendicular to the support plate may pass through the at least one substrate support disposed within the tank. The method may further include, without removing the at least one substrate support from the cleaning liquid within the tank, directing sonic waves at an ultrasonic frequency from multiple pairs of ultrasonic transducers coupled to the tank to one or more surfaces of the at least one substrate through the cleaning liquid. The multiple pairs of ultrasonic transducers may be arranged in a mirror symmetric manner on opposite sides of the central plane.

Various embodiments of the disclosed method may alternatively or additionally include one or more of the following features: each ultrasonic transducer of the multiple pairs of ultrasonic transducers may include a longitudinal axis inclined at an angle between about 40-50° with the central plane; the plurality of megasonic transducers of the megasonic transducer array may be arranged parallel to each other and extend perpendicular to the central plane; the plurality of megasonic transducers may include at a first set of megasonic transducers spaced apart from each other by a first distance and a second set of megasonic transducers spaced apart from each other by the first distance, wherein the first set and the second set may be spaced apart from each other by a second distance greater than the first distance; the at least one substrate support may include at least two substrate supports, and each substrate support may include a plurality of substrates spaced apart from each other such that each substrate of the plurality of substrates extend substantially perpendicular to the central plane.

In yet another embodiment, a method of cleaning at least one substrate is disclosed. The method may include disposing at least one substrate support in a cleaning liquid within the tank. The at least one substrate support may include the at least one substrate positioned thereon. The method may also include activating multiple pairs of ultrasonic transducers coupled to the tank to direct sonic waves at an ultrasonic frequency to one or more surfaces of the at least one substrate through the cleaning liquid. The method may further include, without removing the at least one substrate support from the cleaning liquid within the tank, activating a megasonic transducer array coupled to the tank to direct sonic waves at a megasonic frequency to one or more surfaces of the at least one substrate through the cleaning liquid.

Various embodiments of the disclosed method may alternatively or additionally include one or more of the following features: the method may further include, without removing the at least one substrate support from the cleaning liquid within the tank, deactivating the multiple pairs of ultrasonic transducers before activating the megasonic transducer array, deactivating the megasonic transducer array a period of time after activating the megasonic transducer array, and reactivating the multiple pairs of ultrasonic transducers after deactivating the megasonic transducer array; the megasonic transducer array may include a support plate with a plurality of megasonic transducers coupled thereto, and a central plane that extends perpendicular to the support plate passes through the at least one substrate support positioned within the tank, and the multiple pairs of ultrasonic transducers may be arranged in a mirror symmetric manner on opposite sides of the central plane; the at least one substrate support may include at least two substrate supports, and each substrate support of the at least two substrate supports may include a plurality of substrates spaced apart from each other such that each substrate of the plurality of substrates extend substantially perpendicular to the central plane, and wherein the plurality of megasonic transducers may include at a first set of megasonic transducers spaced apart from each other by a first distance and a second set of megasonic transducers spaced apart from each other by the first distance, wherein the first set and the second set may be spaced apart from each other by a second distance greater than the first distance; each ultrasonic transducer of the multiple pairs of ultrasonic transducers may include a longitudinal axis inclined at an angle between about 40-50° with the central plane; the multiple pairs of ultrasonic transducers may include between 2-20 pairs of ultrasonic transducers.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It should be noted that the figures only depict some exemplary embodiments of the current disclosure and there can be many variations. The figures illustrate embodiments used to describe some features of the current disclosure. It is understood that various combinations of the structures, components, and/or elements, other than those specifically shown, are contemplated and are within the scope of the present disclosure. Specifically, the scope of the current disclosure is defined by the claims and not by the specific embodiments illustrated in the figures.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between features in a figure. Additionally, even if it is not specifically mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another variation is specified). For example, a feature disclosed as being about "t" units long (wide, thick, etc.) may vary in length from (t−0.1 t) to (t+0.1 t) units. Similarly, a temperature within a range of about 100-150° C. can be any temperature between (100−10%) and (150+10%). In some cases, the specification also provides context to some of the relative terms used. For example, a structure described as being substantially linear or substantially planar may deviate slightly (e.g., 10% variation in diameter at various locations, etc.) from being perfectly circular or cylindrical. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

Figure 1:
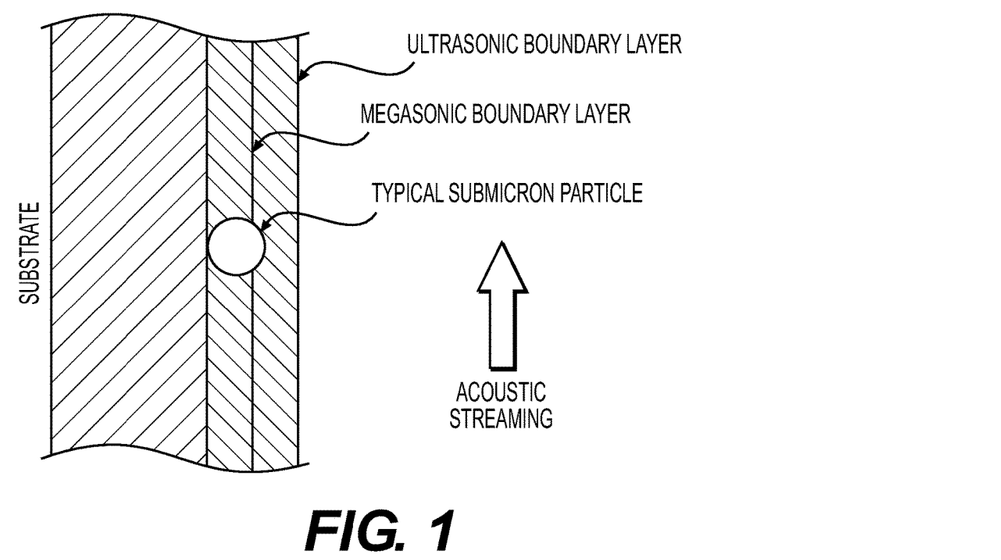
FIG. 1 is a schematic representation of a particle on the surface of a part exposed to ultrasonic and megasonic frequency waves.

The terms "ultrasonic" and "megasonic" describe the science of sound waves above the limits of human audibility. The frequency of a sound wave determines its tone or pitch. Low frequencies produce low or bass tones. High frequencies produce high or treble tones. Ultrasound is a sound with a pitch so high that it cannot be heard by the human ear. Frequencies above 18 kHz are usually considered to be ultrasonic and frequencies above 350 kHz are often considered to be megasonic. The frequencies typically used for ultrasonic cleaning range from 25,000 cycles per second or 25-270 kHz. The frequencies typically used for megasonic cleaning range from 430 kHz-5 MHz FIG. 1 is a schematic representation of a particle on the surface of a part disposed in a cleaning liquid and exposed to ultrasonic and megasonic frequency waves. Ultrasonic and megasonic cleaning generally works by generating cavitation bubbles in the cleaning liquid. Cavitation bubbles form when sonic energy creates a void (or cavity) which gets trapped as a bubble in the cleaning liquid. These microscopic bubbles implode with such force that particles (e.g., contaminants) adhering to surfaces are dislodged. Cavitation resulting from ultrasonic waves typically result in the removal of larger sized particles from the surface of the part. See, e.g., "The Impact of Ultrasonic Frequency on Particle Removal," Jonathan Harman & Edward W. Lamm, 2002 Clean Tech symposium proceedings. Typically, ultrasonic cleaning (or cleaning at ultrasonic frequencies) is used to clean particles having a size larger than about one micron from the surface of a part. See, e.g., Particle Size Removal vs. Ultrasonic Frequency, John Fuchs, Sep. 30, 2019 available at https://techblog.ctgclean.com/2019/09/micron-size-vs-frequency/.

Megasonic cleaning is typically used to remove sub-micron sized particles. As a megasonic wave propagates through the cleaning liquid, wave troughs produce areas of low pressure where microscopic bubbles form. When the high pressure wave peak arrives, the bubbles collapse and release a substantial amount of energy. The energy from many small bubbles collapsing at the same time acts on the surface of the part being cleaned, breaking up, dissolving, and removing particles from the surface. As the frequency rises, the waves are closer together and there is less time for bubbles to form. As a result, higher frequencies produce smaller bubbles and gentler cleaning action as the collapsing bubbles produce less energy. At megahertz frequencies, the bubble size approaches the size of sub-micron particles, but the energy released by the collapsing bubbles is small enough that it may not damage the part surface. However, the released energy may be sufficient to dislodge smaller particles on the surface. Typically, sub-micron sized particles are harder to remove because they are small enough to be embedded in the boundary layer between the solid substrate and the free-flowing cleaning liquid. Even when the cleaning liquid moves quickly under pressure, the boundary layer remains static and holds tiny particles in place. At megasonic frequencies (or during megasonic cleaning), microscopic bubbles move right up to the particles and, when a bubble collapses, the resulting energy burst dislodges the particle. The megasonic waves produces a stream or a current (called acoustic streaming) that takes smaller particles away from the surface of the part and prevent them from becoming attached again. This process effectively removes sub-micron sized particles from the part surface. See, e.g., Megasonic Cleaning of Wafers in Electrolyte Solutions: Possible Role of Electro-Acoustic and Cavitation Effects, Manish Keswani, A Dissertation Submitted to the Faculty of the Department of Chemical an Environmental Engineering, The University of Arizona, 2008. For sub-micron sized particles, the required cavitation energy for particle removal at megasonic frequencies is lower, and therefore, structural damage on the part may be lower.

In some embodiments of the current disclosure, ultrasonic and megasonic frequencies are alternately applied to the surface of a part to alternately remove large and small sized particles from the part surface in a single cleaning step or process. In some embodiments, ultrasonic and megasonic frequencies are simultaneously applied to simultaneously remove large and small particles from the part surface in a single cleaning step/process. Although the current disclosure may generally be used to remove particles from the surface (e.g., clean the surface) of any part, removal of particles from the surface of a "substrate" is described below. The term "substrate" is used broadly herein to refer to any integrated circuit (IC) device or optical device or component of these devices. For example, as used herein, a substrate may include a semiconductor wafer having opposite flat surfaces, a glass panel, a printed circuit board (PCB), an organic substrate, an electronic package with structures (e.g., IC die, etc.) thereon, an electronic device with circuits, an optical package, an optical device, or any other electronic or optical component or device. In some embodiments, the substrate being cleaned may be a semiconductor wafer between or after various stages of its fabrication (e.g., slice, laser mark, planarize, chemical mechanical polish (CMP), etc.). See, e.g., Cleaning Silicon Wafers for Research & Development, available at https://www.universitywafer.com/how-to-clean-silicon-wafers.html. In some embodiments, the substrate being cleaned may be a wafer between or after different IC fabrication processes (deposition, etching, etc.). See, e.g., Semiconductor Cleaning: Processes, Methods and Reasons, available at https://www.utmel.com/blog/categories/semiconductor/semiconductor-cleaning-processes-methods-and-reasons.

The removal of particles stuck, attached, adhered, redeposited, or otherwise disposed (in any manner) on a substrate surface is generally referred to herein as cleaning the surface. As explained previously, when an acoustic field is applied to a liquid, sound waves move through the liquid and produce variations in the liquid's pressure. During the low-pressure portion of the acoustic wave, if the liquid pressure momentarily drops below the liquid vapor pressure, cavities or bubbles are formed. After forming, these bubbles are set in motion by the macroscopic pressure wave. On a microscopic scale, fluid friction with the surface of the substrate causes a thin layer of solution to move more slowly than the bulk solution. This slower moving layer of liquid is called the boundary layer. The boundary layer effectively shields the substrate surface from fresh cleaning liquid and shields particles attached to the surface of the substrate from the forces of the bulk fluid flow. As illustrated in FIG. 1, megasonic boundary layer is comparatively smaller than the ultrasonic boundary layer which may which result in efficient small particle removal. Moreover, when a megasonic sound field is applied to the cleaning liquid, a velocity is generated in the liquid, known as acoustic streaming. Acoustic streaming velocity is added to the bulk velocity of the liquid further reducing the boundary layer and exposing smaller particles to the bulk flow forces. The devices and methods of the current disclosure are optimized to have effective particle removal with least circuit damage. Process variables (e.g., chemistry of cleaning liquid, frequency of sonic waves, power of ultrasonic and megasonic transducers, temperature of cleaning liquid, times of exposure to the ultrasonic and megasonic waves, location of the substrate, etc.) may be controlled and varied in different embodiments. In some exemplary embodiments, a cleaning device (or apparatus) of the current disclosure includes a cleaning tank with both (e.g., a combination of) ultrasonic and megasonic transducers to simultaneously or alternately apply both ultrasonic and megasonic frequencies to one or more substrates disposed in the tank.

Figure 2:
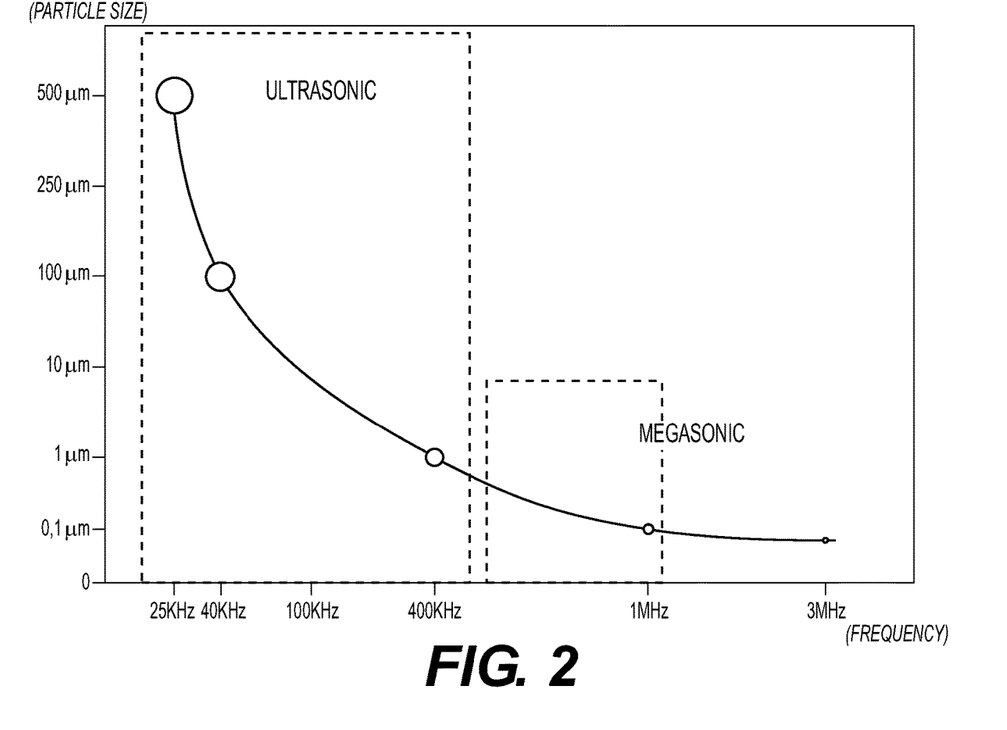
FIG. 2 is a graph illustrating the size of particles that may be removed at ultrasonic and megasonic frequencies in exemplary embodiments of the current disclosure.

FIG. 2 is a graph that illustrates the size of particles that may be removed at ultrasonic and megasonic frequencies in exemplary embodiments of the current disclosure. In some disclosed embodiments, the applied ultrasonic frequencies may range from about 25 KHz to about 500 KHz (about 25-500 KHz) and the applied megasonic frequencies may range from about 600 KHz to about 900 KHz (about 600-900 KHz). As illustrated in FIG. 2, the applied ultrasonic frequencies may remove particles larger than about 4 microns effectively. Meanwhile, the applied megasonic frequencies may remove smaller particles, for example, up to about 0.1 micron effectively.

Figure 3A:
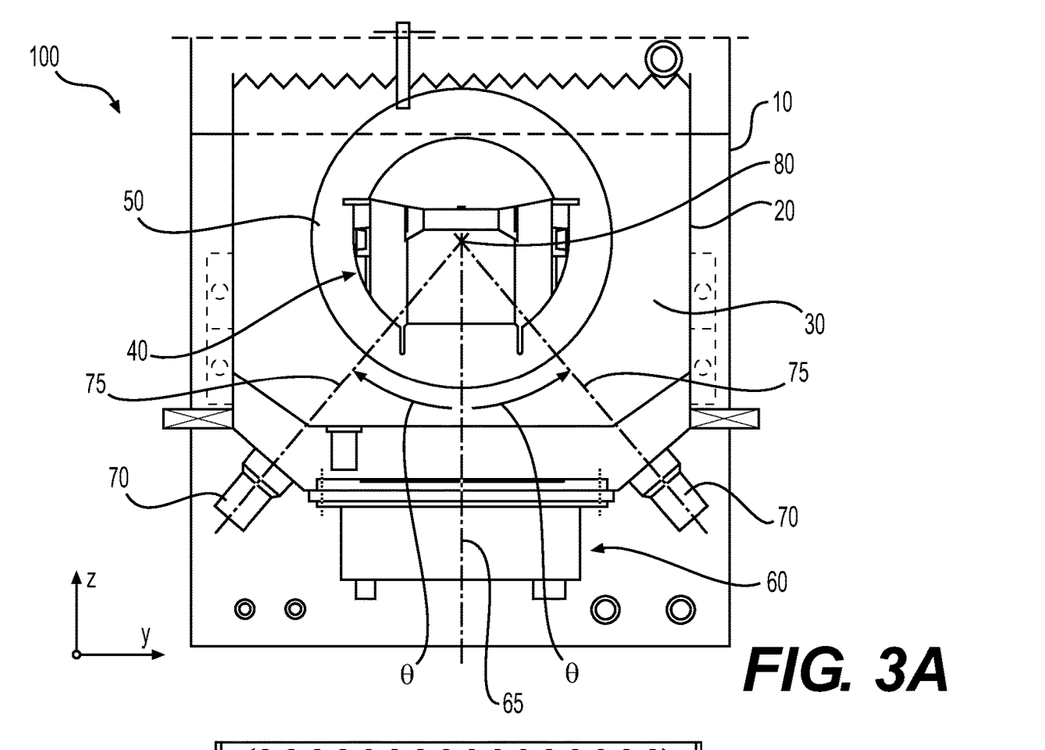
FIGS. 3A-3D illustrate different views of an exemplary cleaning device of the current disclosure.
Figure 3B:
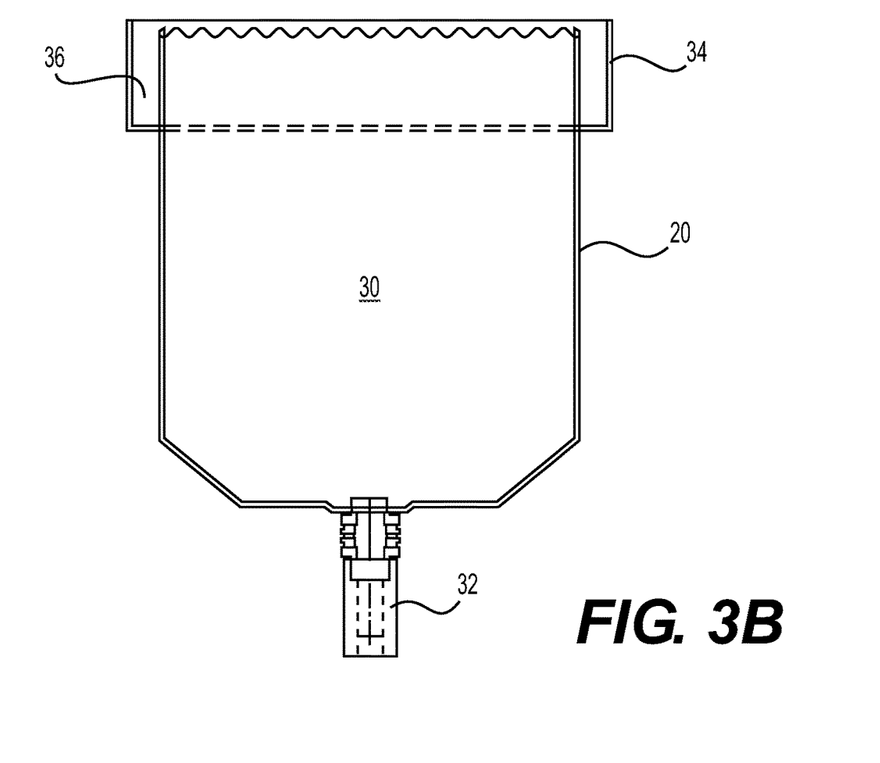
Figure 3C:
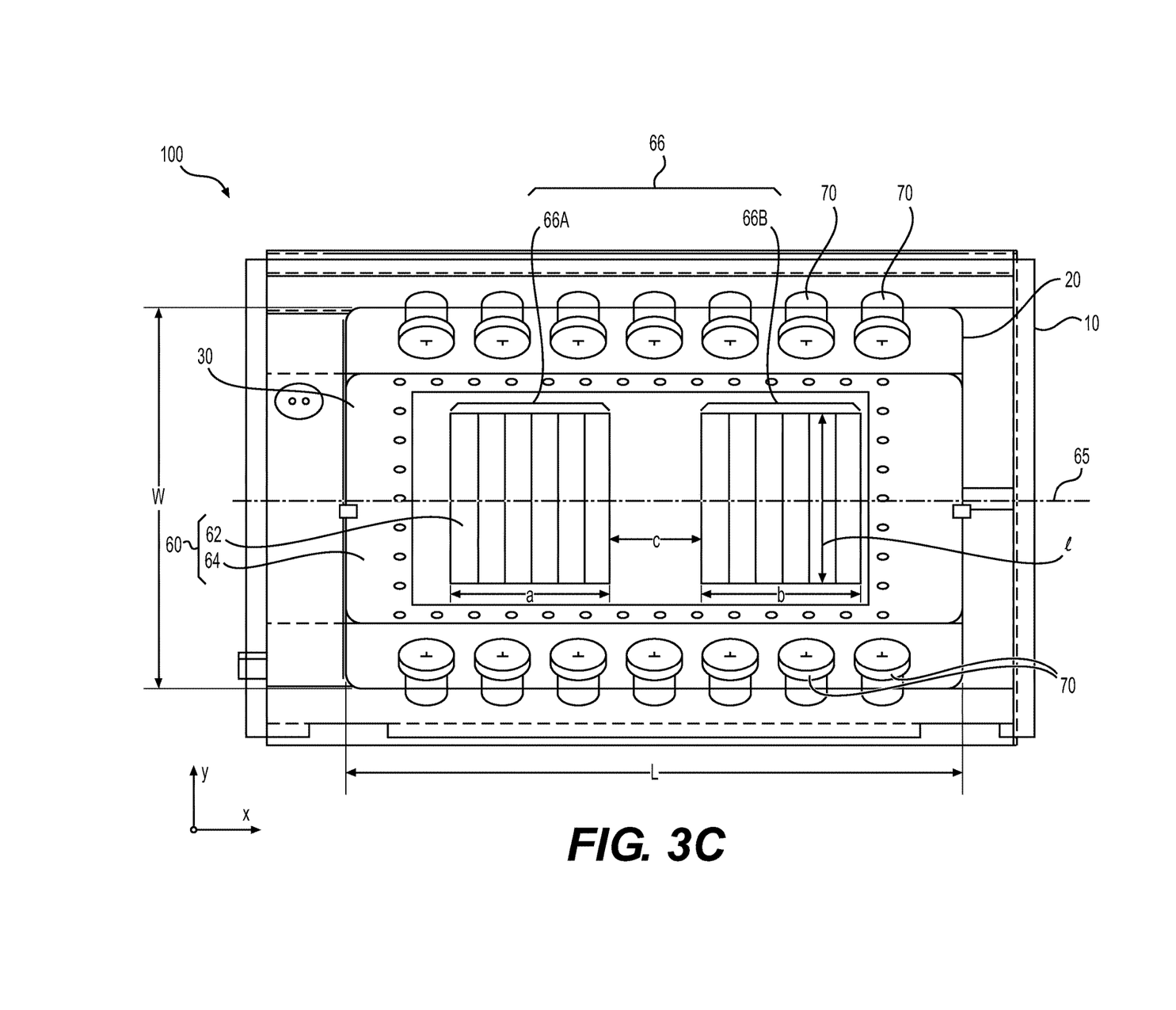
Figure 3D:
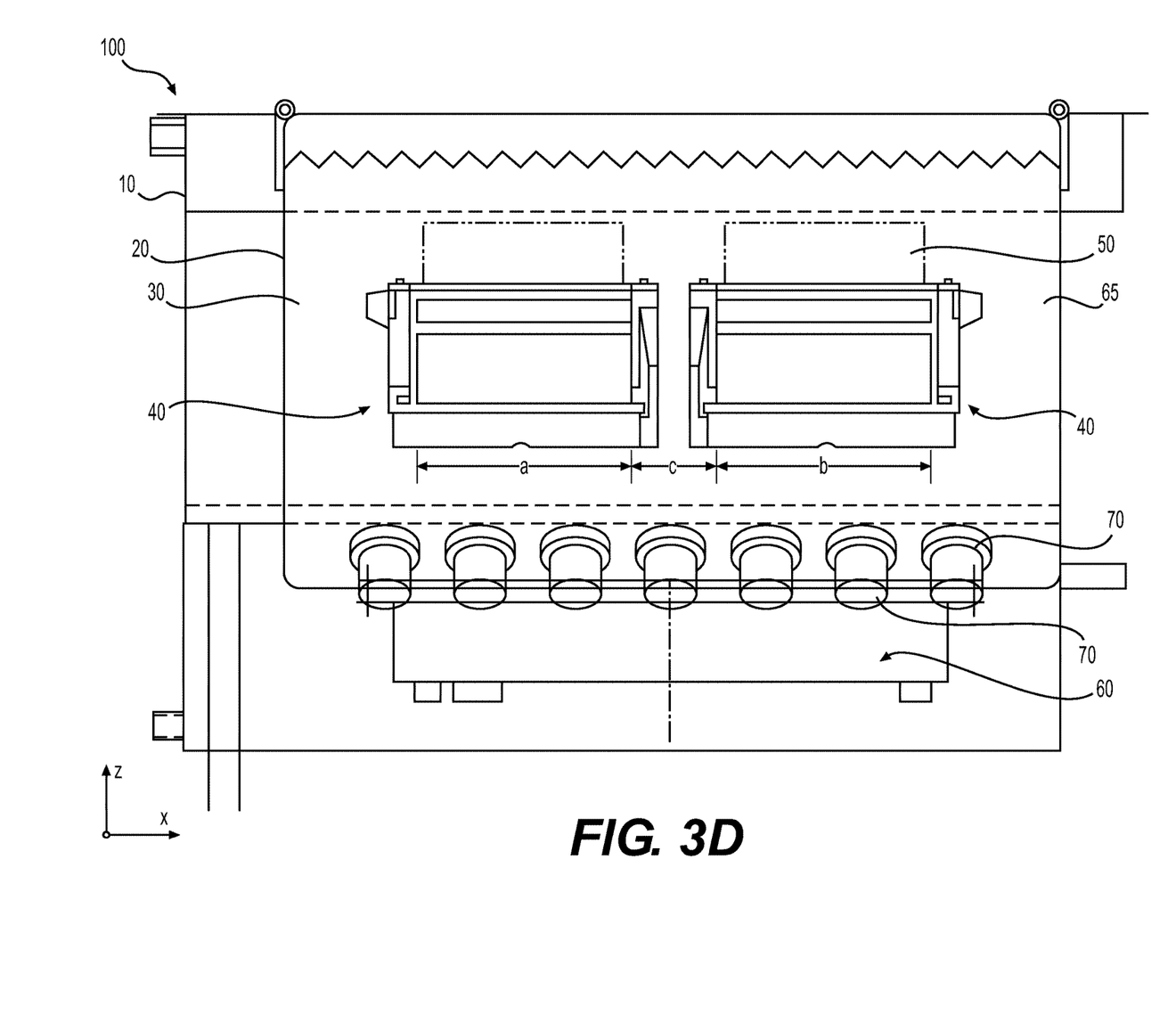

FIGS. 3A-3D illustrate different views of an exemplary cleaning apparatus or device 90 of the current disclosure. FIG. 3A illustrates a front view of the device, FIG. 3B illustrates a front view of a component (e.g., liner) of the device, FIG. 3C illustrates a top view of the device, and FIG. 3D illustrates a side sectional view of the device. In the discussion below, reference will be made to FIGS. 3A-3D. Device 90 includes a cleaning tank 10 configured to contain a chemical composition (referred to herein as a cleaning liquid 30) therein. In general, any type of a liquid may be used at cleaning liquid 30. For example, water (e.g., deionized water), alcohol, Standard Clean 1 (or SC1, e.g., 5:1:1 $H_2O:H_2O_2:NH_4OH$), Standard Clean 2 (or SC2, e.g., 6 parts deionized water, 1 part hydrochloric acid and 1 part hydrogen peroxide or HPM (hydrochloric/peroxide mixture), or any other cleaning chemistry). The type and chemical composition of the cleaning liquid may generally depend on the application (e.g., type of substrate, the process that the substrate underwent before cleaning, the process that the substrate will undergo after cleaning, etc.).

Tank 10 may be made of any suitable material (e.g., stainless steel, aluminum, etc.). In some embodiments, where the cleaning liquid used is not compatible with the tank material, a liner made of a material compatible with the cleaning liquid may be used to hold the cleaning liquid in the tank 10. FIG. 3A shows a liner 20 containing (or holding) the cleaning liquid 30 in tank 10. Liner 20 may be made of any material (e.g., quartz, etc.) compatible with the cleaning liquid 30 used. FIG. 3B shows a liner 20 separated from tank 10. Tank 10 may have any size and cross-sectional shape (rectangular, square, circular, etc.). In some embodiments, the tank 10 and liner 20 may be substantially rectangular (see, e.g., FIG. 3C). In some embodiments, the space or volume between the tank 10 and the liner 20 may be filled with water (or any other suitable liquid) for efficient transfer of acoustic energy to the cleaning liquid 30. With reference to FIG. 3C, liner 20 may have a length L extending parallel to the X-axis and a width W extending parallel to the Y-axis.

With reference to FIG. 3B, liner 20 may include a inlet port 32 configured to direct the cleaning liquid 30 into the liner 20. In some embodiments, inlet port 32 may be provided at the bottom of the liner 20 to admit the cleaning liquid 30 into the liner 20 through its base. Although inlet port 32 is shown as being centrally located in liner 20, this is only exemplary. In general, inlet port 32 may be provided at any location (see, e.g., FIG. 4B). Liner 20 may also include a weir 34 at the top (e.g., at its top rim) that defines an outlet passage (outlet port 36) for the cleaning liquid 30. The cleaning liquid 30 may enter the liner 20 through the inlet port 32, fill the volume of the liner 20, and flow out of the liner 20 through the outlet port 36 into a channel 38 (see, e.g., FIG. 4B) formed between the inner surface of the tank 10 and the outer surface of the liner 20. Such a flow pattern may be referred to as up-flow recirculation. In some embodiments, the cleaning liquid may be admitted from the top of the liner and discharged from the bottom of the liner (e.g., down-flow recirculation). The cleaning liquid 30 discharged from the tank 10 may be treated and recirculated back into the liner 20 or may be discarded. In some embodiments, the cleaning liquid 30 admitted into liner 20 through the inlet port 32 may be heated (e.g., to a process temperature). Alternatively or additionally, in some embodiments, the liner 20 and/or tank 10 may include one or more heaters (e.g., resistance heaters, etc.) and/or cooling devices configured to heat and/or cool the cleaning liquid 30 contained in the liner 20. In some embodiments, liner 20 and/or tank 10 may also include one or more temperature sensors or thermocouples configured to measure the temperature of the liquid 30.

Figure 4A:
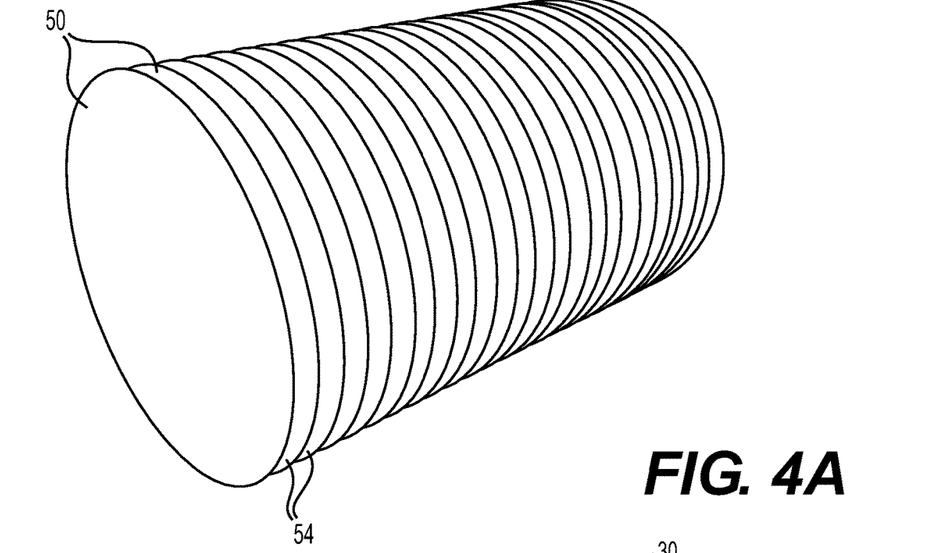
FIG. 4A illustrates one embodiment of substrates that may be cleaned using the cleaning device of FIGS. 3A-3D consistent with the current disclosure.

One or more substrate supports 40 may be disposed in liner 20 to support the substrates 50 that are to be cleaned using the device 90. Any type of substrate support may be used. The structure and configuration of the substrate support 40 may depend on the application (e.g., the number and configuration—round, square, rectangular, etc. of the substrates 50, etc.). In some embodiments, a commercially available substrate support may be used to support the substrates 50 within the liner 20. For example, in some embodiments, as illustrated in FIG. 4A, the substrates 50 may be semiconductor wafers. In such embodiments, a commercially available wafer cassette (e.g., from Entegris, Empak, etc.) may be used to support multiple substrates (e.g., 25, 50, 100, etc.) within the liner 20. The multiple substrates 50 may be supported with a gap 54 between adjacent wafers such that the opposite sides (or opposite surfaces) of the substrates 50 are exposed to the cleaning liquid 30 in the liner 20 (see, e.g., FIG. 4B). Regardless of the type and configuration of the substrates 50 (e.g., IC devices, rectangular/square panels, etc.), the support structure 40 used to support these substrates 50 in the liner 20 may keep the surfaces of the substrates 50 that are to be cleaned exposed to the cleaning liquid 30 in the liner 20. In some embodiments, as illustrated in FIGS. 3A and 3D, the substrate support(s) 40 may be configured to submerge the substrates 50 in the cleaning liquid 30. In some embodiments, tank 10 may include a single substrate support 40. In some embodiments, multiple spaced-apart substrate supports 40 may be provided. For example, FIG. 3D illustrates two spaced-apart substrate supports 40 in a single tank 10. Each substrate support 40 may support one or more substrates 50 thereon.

Tank 10 may also include a megasonic transducer array 60 and a plurality of ultrasonic transducers 70. In some embodiments, the megasonic transducer array 60 and the ultrasonic transducers 70 may be attached to (or embedded in) the body of the tank 10. An ultrasonic transducer is a device that converts electrical energy into high-frequency sound waves (typically above 20 kHz). Ultrasonic and megasonic transducers operate on the principle of piezoelectricity, where a piezoelectric material, such as quartz or ceramics, generates an electrical charge when subjected to mechanical stress, and vice versa. For example, an electrical signal is applied to a piezoelectric material, causing it to vibrate and generate sound waves. These sound waves are then transmitted to the substrate through the walls of the liner 20 and the cleaning liquid 30 for cleaning the surfaces of the substrates. The ultrasonic transducers used in the disclosed apparatus may, In general, have any shape and size. For example, they may be linear, convex, cylindrical, phased array, etc., and may be designed to operate at different frequencies and with different power levels. A megasonic transducer is a type of ultrasonic transducer that produces high-frequency sound waves that are transmitted to the substrate through the cleaning liquid 30. These high-frequency waves are used to remove smaller sized particles and contaminants from the surface of the substrate without damaging it. A megasonic transducer may include a piezoelectric material sandwiched between two metal plates. When an electrical signal is applied to the piezoelectric material, it vibrates and produces high-frequency sound waves that are transmitted through the metal plates and into the cleaning liquid 30 through the walls of the liner 20. Although not shown in the figures and described in detail herein, the megasonic and ultrasonic transducers may be operatively coupled to power supplies and/or other control devices to enable activation of the transducers and to change their output power (e.g., power level of the energy waves they emit). In some embodiments, the frequency of the energy waves emitted by the megasonic and/or ultrasonic transducers may also be varied, for example, using the power supplies and/or other control devices.

With reference to FIG. 3C, the megasonic transducer array 60 may include a support plate 64 (e.g., a steel plate) with a plurality 66 of megasonic transducers 62 attached thereto (or embedded thereon). Each megasonic transducer 62 of the plurality 66 (of megasonic transducers) may have an elongate shape, and the plurality of megasonic transducers 62 may be arranged parallel to each other on the plate 64. The support plate 64 may be coupled to the tank 10 such that the plurality of megasonic transducers 62 extend lengthwise in the width W direction of the liner 20. For example, in some embodiments, as shown in FIG. 3C, the length direction € of each megasonic transducer 62 extends along the width W of the liner 20. And multiple transducers 62 are arranged side-by-side in the direction of the length L of the liner 20 to form the plurality 66 of megasonic transducers. In some embodiments, each transducer 62 of the plurality 66 may be arranged parallel to the width W and perpendicular to the length L of the liner 20.

The plurality 66 of megasonic transducers may include any number (e.g., 2-40) of megasonic transducers 62 arranged parallel to each other side-by-side. In some embodiments, as illustrated in FIG. 3C, the megasonic transducer array 60 may include a first plurality 66A and a second plurality 66B of megasonic transducers 62. The second plurality 66B may be spaced apart in the length L direction of the liner 20 from the first plurality 66A by a distance "c." In general, any number of megasonic transducers 62 may be arranged parallel to each other to form the first plurality 66A and the second plurality 66B. The parallelly arranged megasonic transducers 62 of each of the first plurality 66A and the second plurality 66B may be spaced apart from each other by any distance less than distance "c." In some embodiments, the transducers 62 of each of the first plurality 66A and the second plurality 66B may be spaced apart from each other by a distance less than ½ of distance "c," a distance less than ¼ of distance "c," or a distance less than ⅛ of distance "c." In some embodiments, the parallelly arranged megasonic transducers 62 of each of the first plurality 66A and the second plurality 66B may contact each other (i.e., spaced apart by a distance of zero). In some embodiments, a first number (e.g., between 2 and 20) of megasonic transducers 62 may be arranged side-to-side to form a first plurality 66A having a length "a," and a second number (e.g., between 2 and 20) of megasonic transducers 62 may be arranged side-to-side to form a second plurality 66B having a length "b." In some embodiments, the number of transducers 62 in the first and second pluralities 66A, 66B, and/or the spacing between the transducers 62 in the first and second pluralities 66A, 66B, may be different such that distance "a" is not equal to distance "b." In some embodiments, the number of megasonic transducers 62, and the spacing between the transducers, in the first and second pluralities 66A, 66B may be the same such that "a" is substantially equal to "b."

Figure 4B:
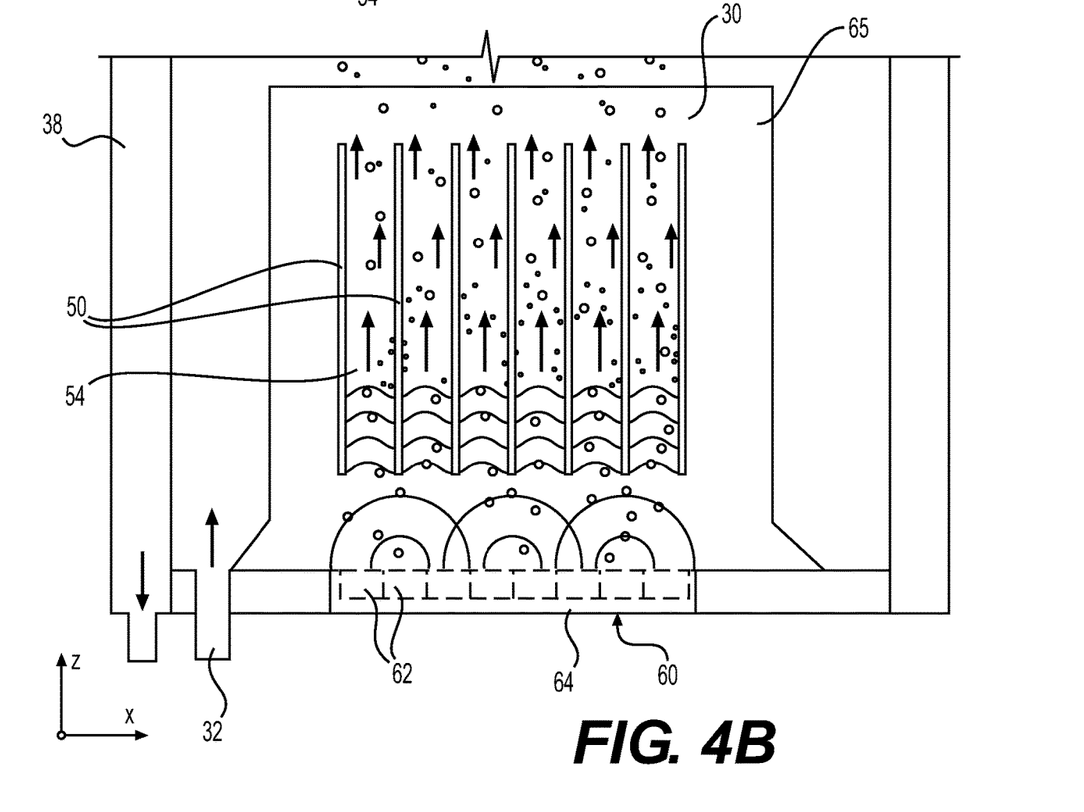
FIG. 4B is a schematic illustration depicting the cleaning of substrates in an exemplary embodiment of the current disclosure.

In general, as best seen in FIG. 3A and FIG. 4B, the location of the megasonic transducer array 60 in the tank 10 may be such that it disposed directly below the substrates 50 positioned in the tank 10. In some embodiments, the area of the plate 64 (in the XY plane, see FIG. 3C) may be greater than or substantially equal to the corresponding area of the substrates 50 (in the XY plane) such that the megasonic waves propagate through the cleaning liquid 30 and (the resulting cavitation and acoustic streaming) applies on all the substrates 50 substantially equally. For the same reason, in some embodiments, the area of the plurality 66 of megasonic transducers 62 may be greater than or substantially equal to the corresponding area of the substrates 50. In embodiments where tank 10 includes two spaced-apart substrate supports 40 (see, e.g., FIG. 3C), the first plurality 66A of megasonic transducers 62 may be located below one substrate support 40 and the second plurality 66B of megasonic transducers 62 may be positioned below the other substrate support 40. Similarly, in embodiments with more than two spaced-apart substrate supports 40, each substrate support 40 may have a corresponding plurality of megasonic transducers positioned directly below. In some embodiments, the area of the plurality of megasonic transducers (in the XY plane of FIG. 3C) below each substrate support may be greater than or substantially equal to the corresponding area of the substrates in that substrate support.

Megasonic transducer array 60 may include a central plane 65 (see FIGS. 3A and 3C) that passes centrally (e.g., at the midpoint of the liner width W) through the plate 64 in the length L direction of liner 20. The central plane 65 may extend perpendicular to the top surface of plate 64. As can be seen in FIG. 3C, the central plane 65 extends perpendicular to the length direction 13 of each megasonic transducers 62 of the array 60. When positioned in the liner 20, the substrates 50 may also extend substantially perpendicular to the central plane 65. For example, when the multiple substrates 50 of FIG. 4A are positioned in liner 20, each substrate 50 (and the gaps 54 between adjacent substrates 50) extends substantially parallel to the length direction l of the megasonic transducers 62. When positioned in this manner, the substrates 50 may also extend substantially perpendicular to the central plane 65. See, for example, FIG. 4B where the central plane 65 extends along the plane of the paper and the length direction l of the megasonic transducers 62 extend into the plane of the paper.

FIG. 4B is a simplified schematic showing the cleaning of substrates (in the form of wafers of FIG. 4A) using megasonic sound fields in an exemplary embodiment of the current disclosure. For clarity of illustration, the ultrasonic transducers 70 of the device are not shown in FIG. 4B. When a megasonic acoustic wave is applied to the cleaning liquid 30 by activating the megasonic transducers 62, the resulting cavitation and the flow of liquid caused by acoustic streaming passes through the gaps 54 between the substrates 50 and removes particles from the opposite surfaces of the substrates. Positioning the substrates 50 in the tank 10 such that the substrates 50 and the gaps 54 (between the substrates) extend substantially parallel to the length direction 13 of the megasonic transducers 62 assists in effectively directing the liquid flow through the gaps 54 and effective cleaning the surfaces (e.g., removing particles from the surfaces). Positioning the megasonic transducers 62 and the substrates 50 parallel to each other may also assist with phase shifting (described later) that improves the efficiency and uniformity of cleaning.

As explained previously, in addition to the megasonic transducer array 60, tank 10 also includes a plurality of ultrasonic transducers 70. Any number (e.g., 4-40) of ultrasonic transducers 70 may be provided in the tank 10. In some embodiments, multiple pairs of ultrasonic transducers 70 may be provided. Any number of pairs (e.g., between 2-20 pairs) of ultrasonic transducers may be provided. In some embodiments, as shown in FIG. 3C, seven pairs of ultrasonic transducers 70 may be spaced-apart in the length L direction of liner 20. As best seen in FIGS. 3A, the two ultrasonic transducers 70 of each pair may be positioned on opposite sides of the megasonic transducer array 60. In some embodiments, the multiple pairs of ultrasonic transducers 70 are arranged in a mirror symmetric manner about the central plane 65 of the megasonic transducer array 60 with the two transducers of each pair positioned on opposite sides of the central plane 65 (see FIG. 3A). As best seen in FIGS. 3C, the ultrasonic transducers 70 of a pair may be positioned on opposite sides of the length direction l of the megasonic transducers 62. Each ultrasonic transducer 70 includes a longitudinal axis 75. As best seen in FIG. 3A, for every pair of ultrasonic transducers 70, the longitudinal axes 75 of the two transducers 70 in the pair may intersect at a common axis-intersection point 80 on the central plane 65 (of the megasonic transducer array 60). The axis-intersection points 80 of the multiple pairs of ultrasonic transducers 70 may trace a line that extends perpendicular to the length direction l of the megasonic transducers 62 on the central plane 75. The longitudinal axes 75 of the two transducers 70 in every pair may also make a common angle θ with the central plane 75. In other words, the longitudinal axis 75 of each ultrasonic transducer 70 may be inclined at an angle θ with a plane that extends perpendicular to the surface of the megasonic transducer array 60. In some embodiments, the angle of inclination θ may be between about 40-50°, or about 45°. In some embodiments, the angle of inclination θ may be between about 260-280°, or about 270°. And in some embodiments, the angle of inclination θ may be between about 80-110°, or about 90°.

It should be noted that the configuration of the cleaning device described above is only exemplary. Many variations are possible. For example, in some embodiments, the plurality of ultrasonic transducers 70 may be coupled to the tank 10 such that the angle of inclination θ may be adjusted or varied. For example, based on the application (e.g., shape and size of substrates, shape and size of tank, type of substrate, type of cleaning liquid, etc.), the angle of inclination θ of each pair of ultrasonic transducers 70 may be varied from a first value to a different second value. In the embodiment described above, where the inlet port 32 is positioned at the bottom of the liner 20 and the outlet port 36 is positioned at the top of the liner 20, the particles that are removed from the substrates 50 flow with the cleaning liquid 30 and are removed from the top (called up-flow recirculation). In some embodiments, the inlet port 32 may be positioned at the top and the outlet port 36 may be positioned at the bottom to create downflow recirculation where the removed particles (that flow down with the cleaning liquid 30) may be assisted by gravity. In some such embodiments, the megasonic transducer array 60 may be positioned at the top of the tank 10 (e.g., rotated by 180° from the location shown in FIG. 3A) and the location of the ultrasonic transducers 70 may be changed, for example, to be inclined at about 45° from the new position of array 60.

Figure 5A:
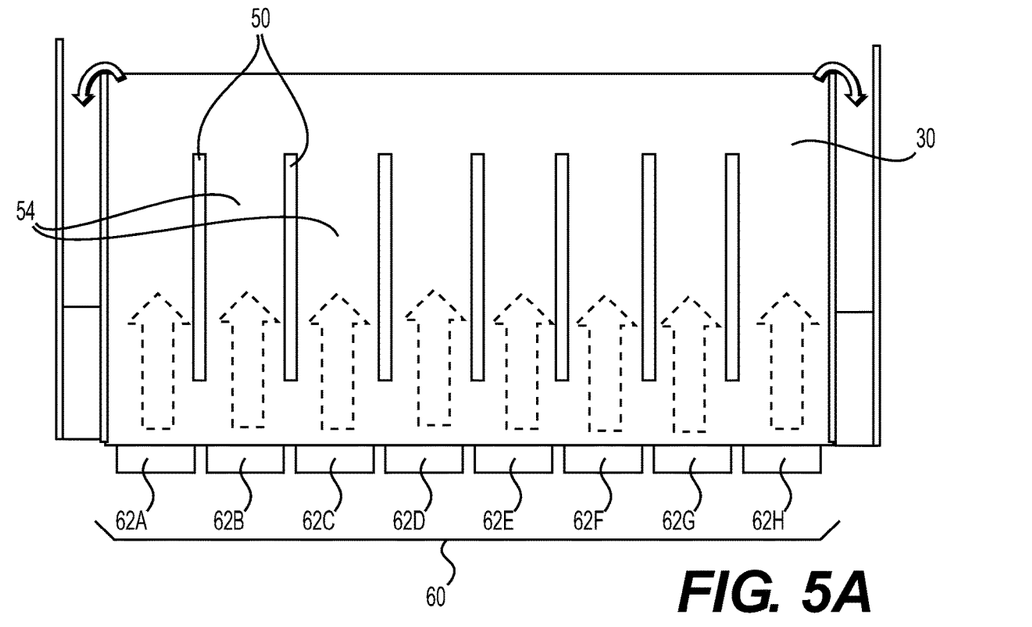
FIG. 5A is a schematic illustration depicting megasonic transducers being activated at the same time in an exemplary embodiment of the current disclosure.
Figure 5B:
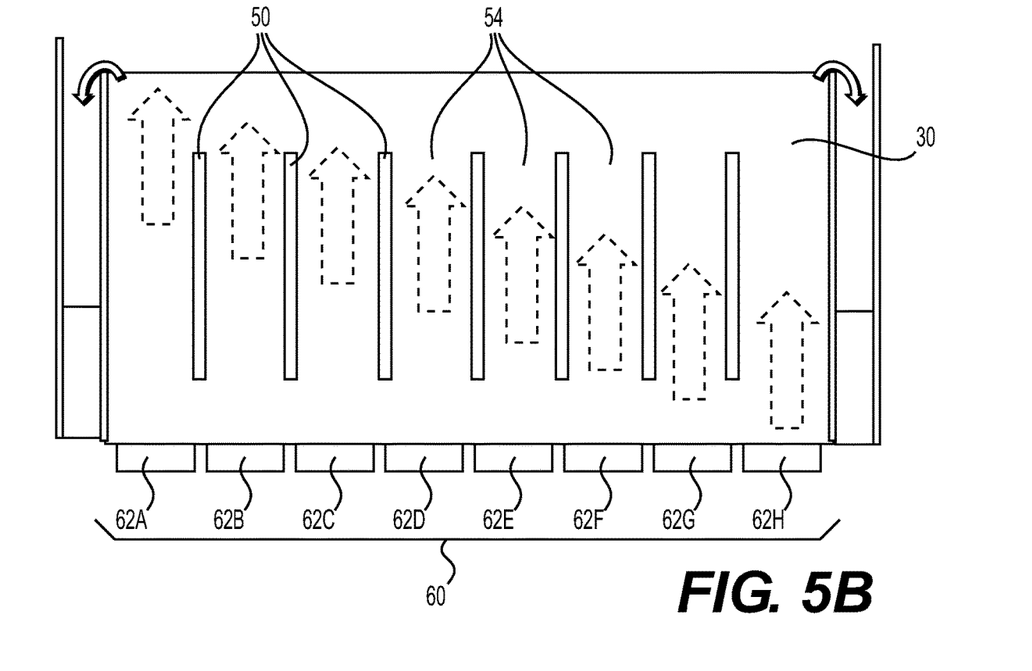
FIG. 5B is a schematic illustration depicting megasonic transducers being activated in a phase-shifted manner in an exemplary embodiment of the current disclosure.
Figure 6A:
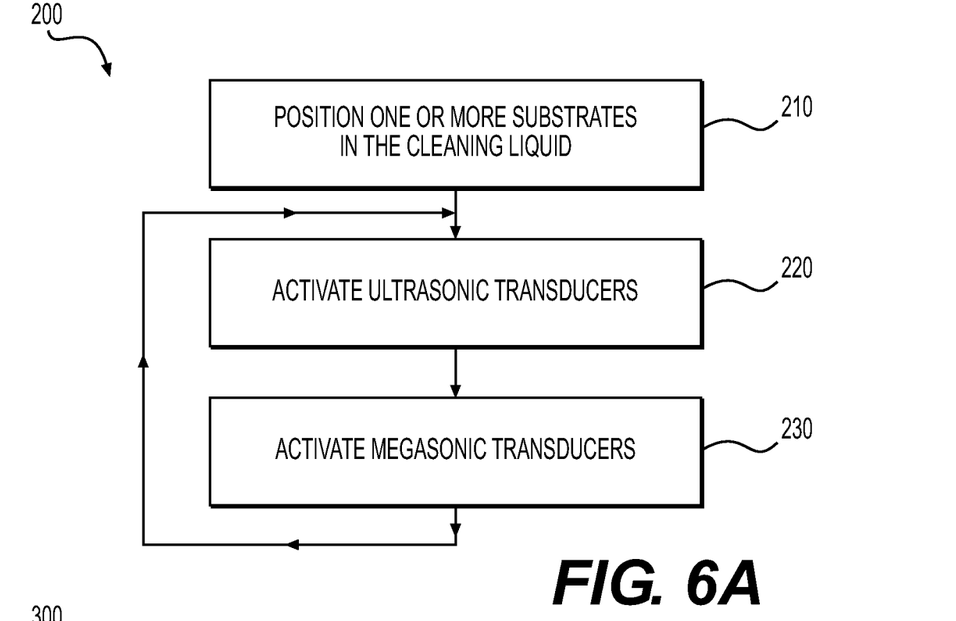
FIGS. 6A-6B are flowcharts depicting exemplary methods of cleaning substrates in exemplary embodiments of the current disclosure.

Exemplary cleaning processes using the above-described cleaning devices will now be described. FIG. 6A is a flow chart of an exemplary process 200 used to clean substrates 50. In process 200, one or more substrates 50 may be positioned in the cleaning liquid 30 contained in the tank 10 of the device (step 210). In embodiments, where a liner 20 is used to contain the cleaning liquid 30, the substrates may be positioned within the liner 20. In some embodiments, the substrates 50 may be submerged in the cleaning liquid 30. As explained previously, the substrates 50 may be positioned in the cleaning liquid 30 such that the substrate(s) 50 (and the gaps 54 between adjacent substrates 50 if multiple substrates 50 are being cleaned) extend in the length direction 13 of the megasonic transducers 62 (see, e.g., FIG. 4B, 5A, 5B). In some embodiments, the substrates 50 and the gaps 54 extend substantially parallel to the length direction 13.

The ultrasonic transducers 70 may be activated (step 220). In some embodiments, the ultrasonic transducers 70 may be activated for a preselected time period ($\Delta T_{ultra}$). In other words, the ultrasonic transducers 70 may be turned on, left on for the preselected time period ($\Delta T_{ultra}$), and then turned off. The preselected time period ($\Delta T_{ultra}$) may be any value of time (e.g., 5 min, 10 min, 15 min, or any other time value), and may depend on the application. For example, when cleaning substrates 50 after a process that produces large-sized particles (or a large amount of large-sized particles) on the surface of the substrates, the ultrasonic transducers 70 may be left on for a longer time.

The megasonic transducers 62 of the megasonic transducer array 60 may be activated (step 230). In some embodiments, the megasonic transducers 62 may be activated after the ultrasonic transducers 70 are deactivated. That is, the ultrasonic and megasonic transducers are alternately activated. In some embodiments, the megasonic transducers 62 may be activated before the ultrasonic transducers 70 are deactivated. That is, the ultrasonic transducers 70 and megasonic transducers 62 may be simultaneously active (or on) at least for some time. In some embodiments, the megasonic transducers 62 may be activated for a preselected time period ($\Delta T_{mega}$). That is, the megasonic transducers 62 may be turned on, left on for the preselected time period ($\Delta T_{mega}$), and then turned off. The preselected time period ($\Delta T_{mega}$) may be any value of time (e.g., 5 min, 10 min, 15 min, or any other time value), and may depend on the application. For example, when cleaning substrates 50 after a process that produces small-sized (e.g., sub-micron) particles (or a large amount of small-sized particles), the megasonic transducers 62 may be left on for a longer time before being turned off. Although not a requirement, in some exemplary embodiments, $\Delta T_{ultra}$ and $\Delta T_{mega}$ may be the same.

As illustrated in FIG. 6A, steps 220 and 230 may be repeated until the substrate surfaces are sufficiently clean. In some embodiments, steps 220 and 230 may be repeated for a selected number of times (10, 20, etc.) or for a selected time (15 min, 30 min, 1 hour, etc.). In some embodiments, the cleaning times (total cleaning time, $\Delta T_{ultra}$, $\Delta T_{mega}$) and/or the number of times steps 220 and 230 are repeated may be determined based on experimentation. After completion of cleaning, the transducers 60, 72 may then be deactivated and the substrates 50 removed from the tank 20. It should be noted that the order of steps 220 and 230 may be reversed in some embodiments of process 200.

Figure 6B:
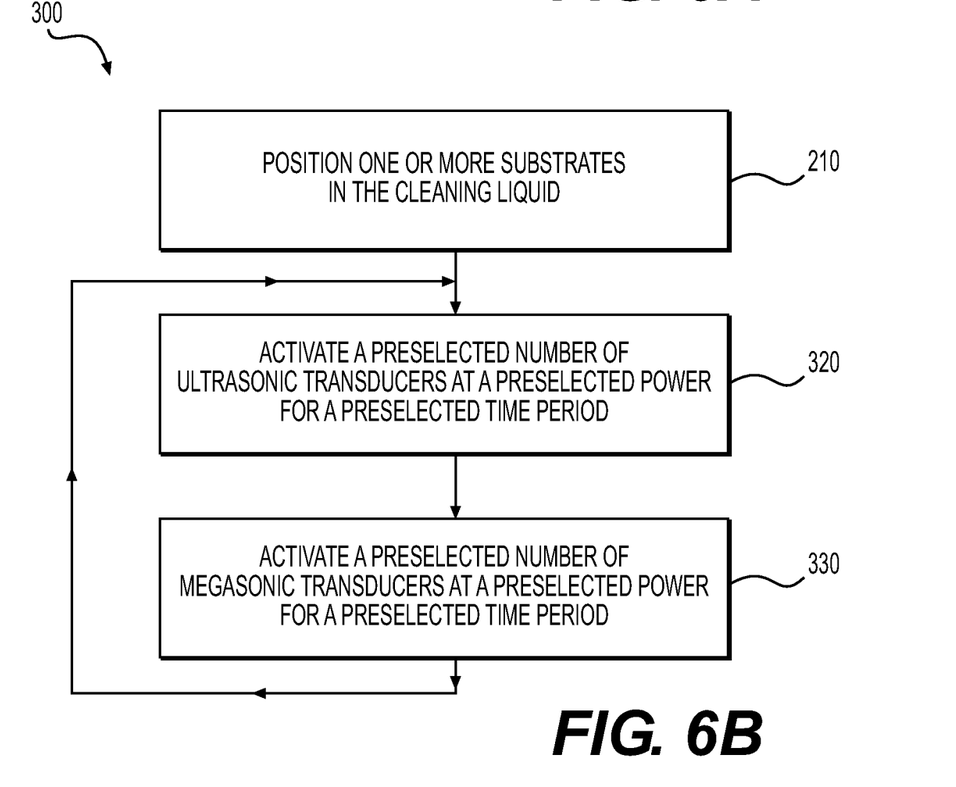

FIG. 6B is a flow chart of another exemplary process 300 used to clean substrates 50. As in process 200, one or more substrates 50 may be positioned in the cleaning liquid 30 of device (step 210). Since step 210 was described with reference to process 200, it is not repeated here. A selected number of ultrasonic transducers 70 may then be activated at a preselected power ($P_{ultra}$) for a preselected time period ($\Delta T_{ultra}$) (step 320). As described with reference to process 200, $\Delta T_{ultra}$ may be any value of time and may depend on the application. Power ($P_{ultra}$) of the ultrasonic transducers 70 may also depend on the application. Increasing power ($P_{ultra}$) may increase the power of the resulting sonic waves and the level of cavitation. In some embodiments, power ($P_{ultra}$) of the ultrasonic transducers 70 may be varied in this step. For example, power ($P_{ultra}$) may be increased (e.g., gradually, linearly, etc.) from, e.g., 0 to 100% during time period ($\Delta T_{ultra}$). Any number of ultrasonic transducers 70 may be activated in this step. For example, in some embodiments, all ultrasonic transducers 70 of the device may be activated at the same time. While in other embodiments, only a smaller number of ultrasonic transducers 70 may be activated. For example, in some embodiments, only every alternate pair (or every third pair) of ultrasonic transducers 70 in the length (L) direction (see FIG. 3C) may be activated. It is also contemplated that, in some embodiments, the ultrasonic transducers 70 may be activated in a phase-shifted manner similar to that described with reference to the activation of the megasonic transducers 62 below.

A selected number of megasonic transducers 62 may be activated at a preselected power ($P_{mega}$) for a preselected time ($\Delta T_{mega}$) (step 330). In some embodiments, the ultrasonic transducers 70 may be deactivated before the megasonic transducers 62 are activated. In some embodiments, the megasonic transducers 62 may be activated before the ultrasonic transducers 70 are deactivated. Thus, in some such embodiments, both ultrasonic transducers 70 and megasonic transducers 62 may be active at the same time at least for some time. As described in process 200, $\Delta T_{mega}$ may be any value of time and may depend on the application. Power ($P_{mega}$) of the megasonic transducers 62 may also depend on the application. Increasing power ($P_{mega}$) may increase the resulting cavitation and acoustic streaming. In some embodiments, power ($P_{mega}$) of the megasonic transducers 62 may be varied in this step. For example, power ($P_{mega}$) may be increased (e.g., gradually, linearly) from, e.g., 0 to 100% during time period ($\Delta T_{mega}$). Any number of megasonic transducers 62 may be activated in this step. In some embodiments, all megasonic transducers 62 of the device may be activated at the same time in this step. While in other embodiments, only a smaller number of megasonic transducers 62 may be activated at one time. For example, in some embodiments, only every alternate megasonic transducer 62 of the array 60 may be activated at one time.

In some embodiments, in step 330, the megasonic transducers 62 may be activated in a phase shifted, or multiplexed, manner. FIG. 5A is a schematic illustration of an exemplary embodiment where all megasonic transducers 62 are activated at the same time (or activated in phase), and FIG. 5B schematically illustrates an exemplary embodiment where the megasonic transducers 62 are activated in a phase-shifted manner. As depicted in FIG. 5A, when all megasonic transducers 62 (e.g. 62A-62H) of the device are activated at the same time, the sonic wave and resulting acoustic streaming affects all the substrates at the same time. Such a power-on scheme may enable maximum power usage. Meanwhile, in the embodiment of FIG. 5B, the different megasonic transducers 62A-62H of the array 60 are activated one after the other (or activated in a phase-shifted manner). For example, the first megasonic transducer 62A in the array is activated first, then the adjacent second megasonic transducer 62B is activated (without deactivating transducer 62A), then the adjacent third megasonic transducer 62C is activated, and so on till the last megasonic transducer 62H in the array is activated. Activating the megasonic transducers in a phase-shifted manner gradually ramps up the power usage of the megasonic transducers. In some applications, powering on the megasonic transducers 62 in step 330 in a phase-shifted manner may improve energy uniformity and improve acoustic energy efficiency and result in uniform particle removal. Phase-shifting may also allow auto switching of individual transducers 62A-62H for higher energy density transmission to the substrates 50. Activating the megasonic transducers 62 in a phase-shifted manner may create a uniform wave within the tank 10 and in between the substrates 50 and result in more efficient cleaning. In some embodiments, the power ($P_{mega}$) of the megasonic transducers 62 may also be adjusted along with phase-shifting to result in an optimized cleaning process with minimal damage to the substrates.

In some embodiments, at the end of step 330, all megasonic transducers 62 may be deactivated (or turned off) at the same time. In some embodiments, the megasonic transducers may be turned off at the end of step 330 in a phase-shifted manner. For example, the different megasonic transducers 62 in the array 60 may be turned off in the same order they were turned on in FIG. 5B (e.g., transducer 62A turned off first, then transducer 62B is turned off, and so on until transducer 62H is turned off). In some embodiments, the different megasonic transducers 62 may be turned off in the reverse order (e.g., transducer 62H turned off first, then transducer 62G, and so on until transducer 62A is turned off). The phase-shifting scheme described with reference to FIG. 5B is only exemplary, and in some embodiments, the megasonic transducers may be phase-shifted in a different manner in step 330. In general, the different megasonic transducers 62A-62B of the array may be activated (and deactivated) in any pattern in step 330. For example, with reference to FIG. 5B, in some embodiments, the two outermost transducers 62A and 62H may be activated first, followed by the two inner adjacent transducers 62B and 62G, and so on. In some embodiments, at the end of step 330, the transducers 62A-62H may be turned off in the same manner.

As illustrated in FIG. 6B, steps 320 and 330 may be repeated until the substrate surfaces are sufficiently clean. As explained with reference to process 200, in some embodiments, the cleaning times (total cleaning time, $\Delta T_{ultra}$, $\Delta T_{ultra}$) and/or the number of times steps 320 and 330 are repeated may be determined based on experimentation. After completion of cleaning, the transducer 60, 72 may then be deactivated and the substrates 50 removed from the tank 20. It should be noted that the order of steps 320 and 330 may be reversed in some embodiments of process 300. In some embodiments, in step 320, the ultrasonic transducers 70 may also be activated (and deactivated in some embodiments) in a phase-shifted manner. For example, with reference to FIG. 3C, one or more pairs of oppositely positioned ultrasonic transducers 70 (e.g., the left-most pair, the right-most pair, the left-most and the right-most pair, etc.) may be activated first, followed by the adjacent pair, etc.

In some embodiments, the temperature of the cleaning liquid 30 may also be adjusted (increased or decreased) to improve the cleaning process. The ability to independently adjust different variables (e.g., $\Delta T_{ultra}$, $\Delta T_{mega}$, $P_{ultra}$, $P_{mega}$, number of ultrasonic transducers activated, number of megasonic transducers activated, temperature of cleaning liquid, etc.) of the cleaning process may enable a wide variety of substrates to be cleaned in an efficient manner using the devices and processed disclosed herein. Furthermore, the ability to activate (and deactivate) the ultrasonic and megasonic sensors in a phase-shifted manner may enable more efficient cleaning of substrates with less power. In general, by activating the transducers in a phase-shifted manner, by varying the inclinations of the ultrasonic and megasonic transducers with respect to the substrate, and by varying and adjusting the different process variables (described above), an optimal cleaning process can be selected for any substrate. Because of the ability to select suitable process conditions for any cleaning application, the disclosed cleaning devices and cleaning methods also appear to be suitable in meeting the future demands of the semiconductor industry. In some embodiments, the disclosed cleaning device may be a fully integrated apparatus that combines the advantages of ultrasonics and megasonics cavitation to achieve uniform and efficient cleaning of the high density interconnect substrates without damaging the circuit/interconnects on the substrates.

It should be emphasized that the number of ultrasonic transducers 70 and megasonic transducers 62 in the exemplary embodiments discussed herein are only exemplary. In general, any number of ultrasonic transducers 70 and megasonic transducers 62 may be provided in devices of the current disclosure. The angular positions of the megasonic and ultrasonic transducers 62, 70 in the tank 10 in exemplary embodiments of the current disclosure are adapted to get effective energy transfer to the substrate. In some embodiments, the positions of the megasonic and/or ultrasonic transducers 62, 70 in the tank 10 may be changed (e.g., swapped, varied, adjusted, etc.). It is also contemplated that, in some embodiments, the position and/or orientation of the substrates 50 in the tank 10 may be varied (e.g., rotated) to change the angular orientations of the megasonic and ultrasonic transducers 62, 70 with respect to the substrate 50. In some embodiments, the substrate support 40 that supports the substrates 50 in the tank 10 (see, e.g., FIG. 3A) may be configured to rotate the substrates 50. For example, the substrate support 40 may be rotated to a first position such that the substrates 50 are inclined (with respect to the ultrasonic and megasonic transducers 70, 62) in one manner for a first cleaning process or operation. The substrate support 40 may then be rotated to a second position such that the substrates 50 are inclined in a different manner for a second cleaning process or operation. In some embodiments, the substrate support 40 may be configured to continuously rotate the substrates 50 during the cleaning process (e.g., process 200, 300). In some embodiments, the tank 10 may include gas inlet ports to direct a selected process gas into the cleaning liquid.

As explained above with reference to exemplary processes 200 and 300, in some embodiments, the ultrasonic and megasonic transducers 70, 62 may be operated simultaneously or alternately. For example, in some embodiments, ultrasonic and megasonic transducers 70 and 62 may be operated simultaneously to remove large-sized and small-sized particles at the same time. In some embodiments, ultrasonic transducers 70 may be activated first for a selected time and deactivated. Then, the megasonic transducers 62 may be activated for a selected time and deactivated. In some embodiments, the megasonic transducers 62 may be activated first for a selected time and then the ultrasonic transducers 70 may be activated for a selected time. Alternate operation of ultrasonic and megasonic transducers 70, 62 may sequentially (or alternately) remove bigger and smaller particles from the surface of the substrates 50. The ultrasonic and megasonic transducers 70, 62 may be activated for any length of time. The ultrasonic and megasonic transducer activation may also be arranged in any sequence—for example, any number of ultrasonic transducer activation followed by any number of megasonic transducer activation, or vice versa. For example, a selected number (a first set) of megasonic transducers 62 may be operated along with a selected number (a second set) of ultrasonic transducers 70 first, followed by a third set of megasonic transducers 62 along with a fifth set of ultrasonic transducers 70.

A person of ordinary skill in the art would recognize that although exemplary embodiments of cleaning devices and cleaning processes are disclosed, the scope of the current disclosure encompasses many variations in the devices and the processes. Furthermore, although the process of cleaning a substrate (e.g., any integrated circuit (IC) or optical device or component of the device) is described, embodiments of the current disclosure may be used to clean any part.

What is claimed is:

1. A device for cleaning a plurality of substrates, comprising:
   a tank configured to contain a cleaning liquid in a tank interior;
   at least one substrate support configured to be positioned within the tank, the at least one substrate support being configured to support the plurality of substrates;
   a megasonic transducer array coupled to the tank and configured to direct megasonic frequency waves to the plurality of substrates, the megasonic transducer array including a support plate and a plurality of megasonic transducers coupled to the support plate, wherein a central plane that extends perpendicular to the support plate passes through the at least one substrate support, wherein each megasonic transducer of the plurality of megasonic transducers has an elongated shape with a length dimension, a height dimension, and a width dimension, wherein for each megasonic transducer, the length dimension is greater than the width dimension and extends perpendicular to the width dimension, and wherein for each megasonic transducer, the width dimension extends perpendicular to the height dimension, and wherein the plurality of megasonic transducers are arranged such that the length dimensions of the plurality of megasonic transducers (a) extend parallel to each other, and (b) extend perpendicular to and across the central plane; and multiple pairs of ultrasonic transducers coupled to the tank and configured to direct ultrasonic frequency waves to the plurality of substrates;

wherein the multiple pairs of ultrasonic transducers are arranged on opposite sides of the central plane and the length dimensions of the plurality of megasonic transducers, and wherein each ultrasonic transducer of the multiple pairs of ultrasonic transducers includes a longitudinal axis inclined at an angle between about 40-50° with the central plane, wherein said longitudinal axis of each ultrasonic transducer is an imaginary line that passes through the tank interior.

2. The device of claim 1, wherein the plurality of megasonic transducers includes at a first set of megasonic transducers spaced apart from each other by a first distance and a second set of megasonic transducers spaced apart from each other by the first distance, wherein the first set and the second set are spaced apart from each other by a second distance greater than the first distance.

3. The device of claim 1, further including a liner positioned within the tank, the liner being configured to receive the cleaning liquid therein.

4. The device of claim 3, wherein the tank includes stainless steel and the liner includes quartz.

5. The device of claim 1, wherein the multiple pairs of ultrasonic transducers include between 2-20 pairs of ultrasonic transducers.

6. The device of claim 1, wherein the at least one substrate support includes at least two substrate supports, and each substrate support is configured to support a plurality of substrates spaced apart from each other.

7. The device of claim 1, wherein the at least one substrate support is configured to support the plurality of substrates such that each substrate of the plurality of substrates extends substantially perpendicular to the central plane.

8. The device of claim 1, wherein the multiple pairs of ultrasonic transducers are arranged equidistant from the central plane.

9. The device of claim 1, wherein each megasonic transducer of the plurality of megasonic transducers generates a frequency between 600-900 KHz, and each ultrasonic transducer of the multiple pairs of ultrasonic transducers generates a frequency between 25-500 KHz.

10. A device for cleaning a plurality of substrates, comprising:

a tank having a length greater than a width, the tank being configured to contain a cleaning liquid in a tank interior;

a substrate support configured to be positioned within the tank, the substrate support being configured to support the plurality of substrates with a gap between adjacent substrates of the plurality of substrates such that opposite sides of the substrate are exposed to the cleaning liquid;

a plurality of megasonic transducers coupled to a support plate of the tank and configured to direct megasonic frequency waves to the plurality of substrates, wherein each megasonic transducer of the plurality of megasonic transducers has an elongated shape with a length dimension, a height dimension, and a width dimension, wherein for each megasonic transducer, the length dimension is greater than the width dimension and extends perpendicular to the width dimension, and wherein for each megasonic transducer, the width dimension extends perpendicular to the height dimension, and wherein each megasonic transducer of the plurality of megasonic transducers is arranged such that its width dimension extends along the length of the tank and its length dimension extends along the width of the tank; and multiple pairs of ultrasonic transducers coupled to the tank and configured to direct ultrasonic frequency waves to the plurality of substrates, wherein the multiple pairs of ultrasonic transducers are arranged on opposite sides of the length dimensions of the plurality of megasonic transducers, and wherein each ultrasonic transducer includes a longitudinal axis inclined such that longitudinal axes of each pair of ultrasonic transducers intersect at a common intersection point within the tank, wherein said longitudinal axis of each ultrasonic transducer is an imaginary line that passes through the tank interior.

11. The device of claim 10, further including a central plane that extends centrally through the width of the tank, and perpendicularly through the length dimension of each megasonic transducer of the plurality of megasonic transducers.

12. The device of claim 11, wherein the central plane further extends substantially perpendicularly through each substrate of the plurality of substrates.

13. The device of claim 11, wherein the longitudinal axis of each ultrasonic transducer is inclined at an angle between about 40-50° with the central plane.

14. The device of claim 13, wherein the longitudinal axis of each ultrasonic transducer is inclined at an angle of about 45° with the central plane.

15. The device of claim 10, wherein the length dimensions of the plurality of megasonic transducers are parallel to each other.

16. The device of claim 10, further including a liner positioned within the tank, the liner being configured to receive the cleaning liquid therein.

17. The device of claim 16, wherein the tank includes stainless steel and the liner includes quartz.

18. The device of claim 10, wherein the multiple pairs of ultrasonic transducers include between 2-20 pairs of ultrasonic transducers.

19. A device for cleaning a plurality of substrates, comprising:

a tank having a length greater than a width, the tank being configured to contain a cleaning liquid in a tank interior;

a substrate support configured to be positioned within the tank, the substrate support being configured to support the plurality of substrates with a gap between adjacent substrates of the plurality of substrates such that opposite sides of the substrate are exposed to the cleaning liquid;

a plurality of megasonic transducers coupled to a support plate of the tank and configured to direct megasonic frequency waves to the plurality of substrates, wherein each megasonic transducer of the plurality of megasonic transducers has an elongated shape with a length dimension, a height dimension, and a width dimension, wherein for each megasonic transducer, the length dimension is greater than the width dimension and extends perpendicular to the width dimension, and wherein for each megasonic transducer, the width dimension extends perpendicular to the height dimension, and wherein the plurality of megasonic transducers are arranged such that their length dimensions extend (a) parallel to each other, (b) along the width of the tank, and (c) parallel to the plurality of substrates; and multiple pairs of ultrasonic transducers coupled to the tank and configured to direct ultrasonic frequency waves to the plurality of substrates, wherein the multiple pairs of ultrasonic transducers are arranged on opposite sides of the plurality of megasonic transducers such that the length dimensions of the plurality of megasonic transducers extend between the multiple pairs of ultrasonic transducers, and wherein each ultrasonic transducer of the multiple pairs of ultrasonic transducers include a longitudinal axis inclined at an angle between about 40-50° with a central plane that extends perpendicularly through the length dimensions of the plurality of megasonic transducers, wherein said longitudinal axis of each ultrasonic transducer is an imaginary line that passes through the tank interior.

20. The device of claim 19, wherein the central plane extends (i) centrally through the width of the tank, and (ii) substantially perpendicularly through each substrate of the plurality of substrates.

* * * * *